(12) United States Patent
Ben-Eliezer et al.

(10) Patent No.: US 8,570,655 B2
(45) Date of Patent: Oct. 29, 2013

(54) OPTICAL MASK FOR ALL-OPTICAL EXTENDED DEPTH-OF-FIELD FOR IMAGING SYSTEMS UNDER INCOHERENT ILLUMINATION

(75) Inventors: Eyal Ben-Eliezer, Kiryat Ono (IL); Emanuel Marom, Tel Aviv (IL); Naim Konforti, Holon (IL); Zeev Zalevsky, Rosh Ha'ayin (IL)

(73) Assignee: Ramot at Tel Aviv University Ltd., Tel Aviv, IL (US)

( * ) Notice: Subject to any disclaimer, the term of this patent is extended or adjusted under 35 U.S.C. 154(b) by 81 days.

(21) Appl. No.: 13/027,286

(22) Filed: Feb. 15, 2011

(65) Prior Publication Data
US 2011/0197428 A1  Aug. 18, 2011

Related U.S. Application Data

(62) Division of application No. 11/078,294, filed on Mar. 14, 2005, now abandoned.

(51) Int. Cl.
*G02B 27/46* (2006.01)

(52) U.S. Cl.
USPC ............................................ 359/559; 359/900

(58) Field of Classification Search
None
See application file for complete search history.

(56) References Cited

U.S. PATENT DOCUMENTS

2002/0195538 A1* 12/2002 Dowsk et al. ............... 250/201.2

* cited by examiner

*Primary Examiner* — Arnel C Lavarias
(74) *Attorney, Agent, or Firm* — Oren Reches

(57) ABSTRACT

A method of optical element manufacturing, the method may include selecting a range of a misfocus parameter ψ; and designing the optical element to include multiple regions, wherein the optical transfer function (OTF) of the optical element allows, for the range of the misfocus parameter .psi., transmission of images with a contrast of at least 10% for all normalized spatial frequencies up to 50% of a theoretical maximum that is attainable with a full aperture in an in-focus condition.

18 Claims, 10 Drawing Sheets

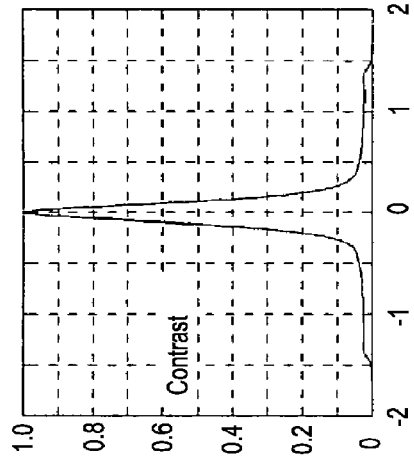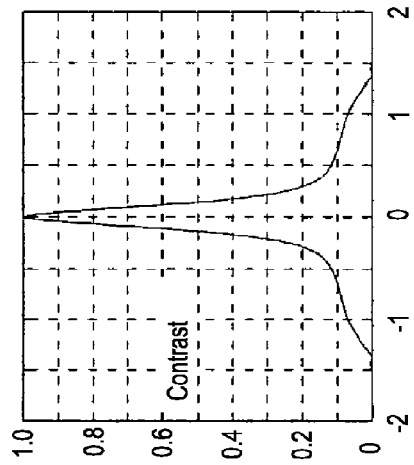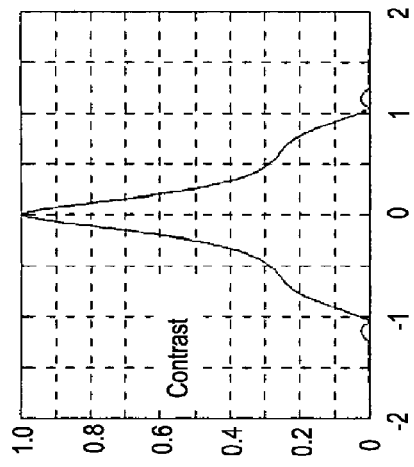
Figure 6A
Figure 6B
Figure 6C
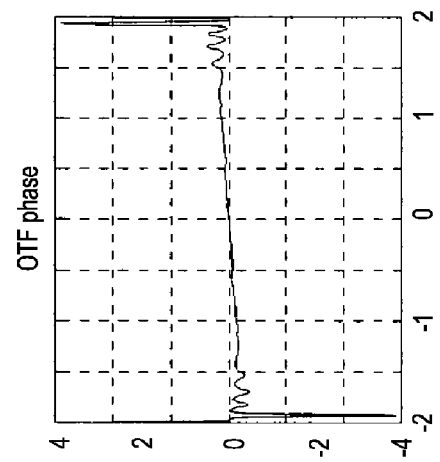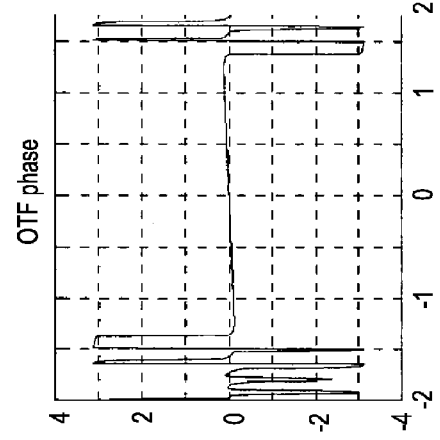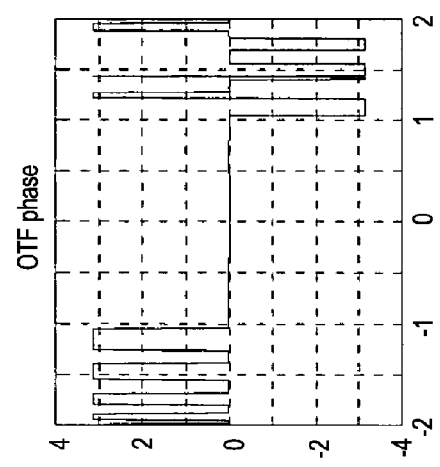
Figure 6D
Figure 6E
Figure 6F

OPTICAL MASK FOR ALL-OPTICAL EXTENDED DEPTH-OF-FIELD FOR IMAGING SYSTEMS UNDER INCOHERENT ILLUMINATION

FIELD AND BACKGROUND OF THE INVENTION

The present invention relates to optical imaging and, more particularly, to a mask for insertion in the pupil of an optical imaging system that provides extended depth of field for imaging scenes located in the extended depth of field region and illuminated by incoherent light without needing to process the image created by the imaging system that incorporates the mask.

Imaging systems are known to require accurate focus alignment. Conventional imaging systems, for example cameras, are very sensitive to misfocus. When the object and image planes are not in conjugate positions, the resultant image is severely degraded. Nevertheless, there are many applications (e.g. barcode reading, computer or machine vision, surveillance cameras, etc.) that require imaging of objects located anywhere within an extended depth of field (DOF) region, while allowing reduced contrast and resolution.

Conventional solutions for imaging systems with an extended DOF involve pupil stopping and apodization. See, for example, M. Mino and Y. Okano, "Improvement in the OTF of a defocused optical system through the use of shaded apertures", *Applied Optics* vol. 10 pp. 2219-2225 (1971); J. O. Castaneda et al., "arbitrary high focal depth with a quasioptimum real and positive transmittance apodizer", *Applied Optics* vol. 28 pp. 2666-2669 (1989); J. O. Castaneda and L. R. Berriel-Valdos, "Zone plate for arbitrary high focal depth", *Applied Optics* vol. 29 pp. 994-997 (1990). The main disadvantages with such solutions are reduced resolution and low light throughput.

Recently, a hybrid opto-electronic approach has been proposed, to solve such problems. See, for example, E. R. Dowski, Jr. and W. T. Cathey, "Extended depth-of-field through wave-front coding", *Applied Optics* vol. 34 (1995) pp. 1859-1866, and J. van der Gracht et al., "Broadband behavior of an optical-digital focus-invariant system", Optics Letters vol. 21 no. 13 (1996) pp. 919-921. Both of these references are incorporated by reference for all purposes as if fully set forth herein. In that approach, a non-absorptive phase mask is used to severely aberrate, or encode, the wavefront of the light wave at the pupil. The aberration distorts the obtained image (sometimes referred to as the "intermediate image"), often so much that the intermediate image is unidentifiable. Nevertheless, the intermediate image is insensitive to misfocus for a wide range of DOF. Image acquisition is followed by a digital signal-processing (DSP) step to recover the final image from the intermediate image. Another approach, by W. Chi and N. George ("Computational imaging with the logarithmic asphere: theory", *Journal of the Optical Society of America* vol. 20 pp. 2260-2273 (2003)) produces distorted images that change with misfocus position. An iterative filter is used in this case to restore the image so as to finally provide imaging with a certain enhanced depth of field. The main advantages of such approaches are that there is no reduction in light power collection, and that theoretically, one can restore the image details up to the optical cutoff spatial frequency. Practically, resolution is limited by CCD pixel size, as well as by the presence of noise, which may even be amplified in the processing stage.

We have proposed a phase mask that consists of sixteen spatially multiplexed Fresnel lenses. See E. Ben-Eliezer et al., "All-optical extended depth of field imaging system", *Journal of Optics A: Pure and Applied Optics* vol. 5 (2003) pp. S164-S169, which reference is incorporated by reference for all purposes as if fully set forth herein. Although the corresponding all-optical imaging system has an extended DOF, this imaging system is suboptimal for scenes illuminated by incoherent light.

There is thus a widely recognized need for, and it would be highly advantageous to have, a mechanism, for extending the DOF, such mechanism being optimized for incoherent illumination and not requiring postprocessing.

SUMMARY OF THE INVENTION

The present invention provides such a mechanism, in the form of an optical element or mask that is inserted in the optical path of an imaging system or that is etched, coated, overlayed or molded on existing optical elements such as lenses, prisms or windows that are already present in the optical path of the imaging system.

According to the present invention, a mask for an optical imaging system is designed by optimizing an optical property (transmittance or reflectance) of the mask relative to the incident intensity distribution (rather than e.g. the incident optical field distribution) on the image plane of the optical imaging system. The mask then is fabricated in accordance with the optimized optical property. The mask overcomes misfocus degradation in the optical imaging system.

Preferably, the optimization is done by selecting a desired point spread function (PSF) intensity $|h_D|^2$, selecting a desired range of a misfocus parameter $\psi$, and adjusting the mask's optical property to minimize a measure of a departure from $|h_D|^2$ of a system PSF intensity $|h|^2$ that is computed from the mask's optical property. The minimization should hold for any position within the selected range of the misfocus parameter. Because the measure is based on PSF intensities rather than on the PSFs themselves, it is independent of the phases of the PSFs. Most preferably, the measure is a minimum mean square error measure, but the scope of the present invention includes any suitable measure.

More preferably, $|h_D|^2$ is selected by steps including selecting a desired optical transfer function (OTF). $|h_D|^2$ is the inverse Fourier transform of the desired OTF. Most preferably, the desired OTF is such that there are no phase differences between its spatial frequency components in a preselected spatial frequency band of interest.

Preferably, the optimizing is effected by steps including simulated annealing.

The scope of the present invention also includes a mask made according to the to method of the present invention. The mask may be one dimensional or two dimensional. A "one-dimensional mask" is a two-dimensional structure that performs a certain operation along only one axis (or direction). The two-dimensional structure of a one-dimensional mask consists e.g. of bars, lines or stripes so that there are no changes in the direction orthogonal to the direction along which the mask operates. A "two-dimensional mask" operates in all directions in a plane, and may operate one way in one direction and another way in the orthogonal direction.

Preferably, in the case of a one-dimensional mask, the phase of the mask is antisymmetric, in order to accommodate a larger range of positions within the depth of field under consideration.

Preferably, the two-dimensional mask is separable, e.g., the product of the transmittances of two orthogonal one-dimensional masks or two orthogonal one-dimensional masks in tandem. Alternatively, the two-dimensional mask is radial, i.e., not varying along the angular coordinate of a polar coordinate system.

Preferably, the one- or two-dimensional mask is real, which means that the phase of the mask transmittance is either 0 or π. Fabrication of such a mask is eased, inasmuch as it requires the implementation of only two phases.

Preferably, the one- or two-dimensional mask is a phase-only mask. Doing without amplitude variations or absorbing portions on the mask simplifies fabrication and increases light throughput.

Preferably, the one- or two-dimensional mask is fabricated as a diffractive optic element, in which phase and amplitude variations are obtained via the phenomenon of diffraction. Preferred fabrication methods include etching, injection molding, deposition and casting of phase or amplitude absorbing overlays on pre-existing surfaces.

The scope of the present invention also includes an optical element that in turn includes a mask of the present invention. The optical properties (e.g. transmissivity or reflectivity) of the optical element incorporate the features provided by the mask. Examples of such optical elements include lenses, filters, windows and prisms.

The scope of the present invention also includes an optical imaging system that includes a mask of the present invention. Examples of such optical systems include general-purpose lenses, computer vision systems, automatic vision systems, barcode readers, cameras, mobile phone cameras, PC-mounted cameras, and surveillance security imaging systems.

BRIEF DESCRIPTION OF THE DRAWINGS

The invention is herein described, by way of example only, with reference to the accompanying drawings, wherein:

FIGS. 6A-6F are magnitude and phase cross sections of the OTF of an imaging system that uses the mask of FIG. 5, at three values of ψ;

Figure 1:
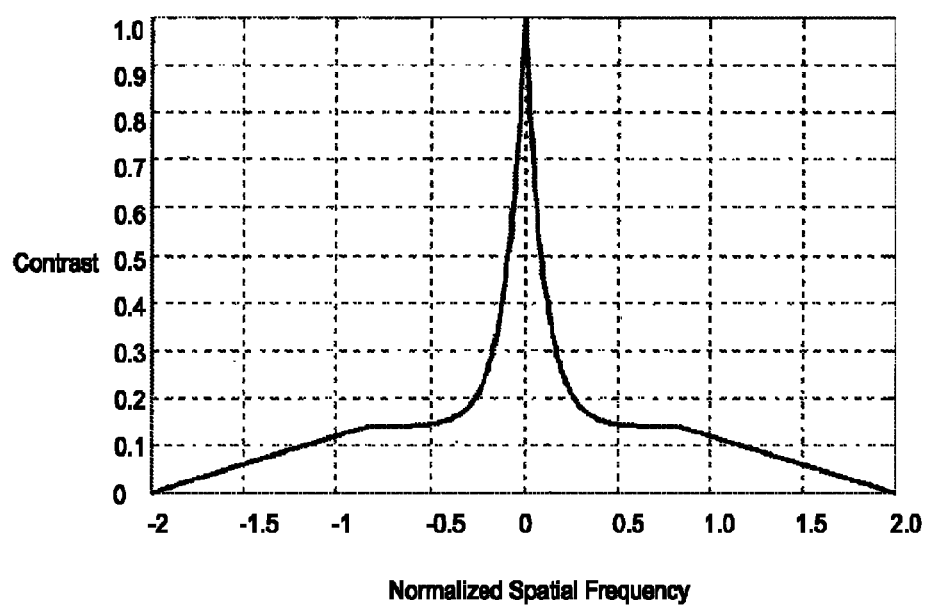
FIG. 1 illustrates a desired OTF.

These Figures are only illustrative. The performance of an optical imaging system varies according to its design requirements or assumptions. These Figures, therefore, illustrate a comparison of the performance of one particular optical imaging system used with incoherently illuminated objects and used with an unmodified conventional aperture, vs. the performance of the same system but including a mask of the present invention in its aperture.

DESCRIPTION OF THE PREFERRED EMBODIMENTS

The present invention is of a design method for a mask that can be used to extend the DOF of an incoherent imaging system.

In the following examples, the mask of the present invention is a transmissive optical element that is characterized by an amplitude and phase transmittance distribution. It is to be understood that the scope of the present invention also includes folded optical arrangements in which the mask is a reflective optical element used in a reflection mode and having a controllable amplitude and phase reflectivity. The performance of an imaging system that uses a reflection-mode mask is identical to the performance of an imaging system that uses an equivalent transmission-mode mask.

Furthermore, although the mask of the present invention is described herein as an independent element introduced in the optical path of an imaging system, it is well-understood by those skilled in the art that the properties of such a mask can be implemented by suitably modifying the surface properties or the bulk properties of an existing optical element such as a lens, a prism, a filter or a glass plate such that the transmission of the modified element is equal to the combined transmissions of the original optical element and the mask of the present invention. Moreover, although one way of implementing the present invention is described herein, it is to be understood that the scope of the present invention includes all such implementations that are consistent with the appended claims.

The principles and operation of an optical mask according to the present invention may be better understood with reference to the drawings and the accompanying description.

As noted above, incoherent imaging systems are linear in intensity, in contrast to coherent imaging systems, which are linear in the optical field distribution. Thus, the phase of the resulting coherent point spread function is not important at all when considering incoherently illuminated systems. To our knowledge, the only method that was suggested to deal directly with incoherent illumination sources is that of Dowski, Jr. and Cathey as cited above. Nevertheless, their method requires post-processing steps in order to reveal the features of the acquired image. We now disclose applicable criteria, tailored for designing all-optical incoherent imaging systems, that do not require post-processing steps. Specifically, we describe design considerations for obtaining an optimal mask transmittance function that compensates for misfocus occurrence, in the sense of a minimum mean square error (MMSE) criterion, applied directly over the intensity distribution in the image plane, thus fitting incoherent illumination scenes.

It is well known that misfocus aberration manifests itself by the appearance of a quadratic phase term at the imaging system pupil, namely $$G(u,v;\psi)=\exp[j\psi(u^2+v^2)] \tag{1}$$

where u and v are the normalized coordinates of the pupil plane. The misfocus parameter, ψ, is the maximal phase difference at the pupil edge due to misfocus aberration, and is provided by the following expression (J. W. Goodman, *Introduction to Fourier Optics* (McGraw-Hill, New York, 1996), p. 148):

$$\psi = \frac{\pi L^2}{4\lambda} \left( \frac{1}{d_{obj}} + \frac{1}{d_{img}} - \frac{1}{f} \right) \quad (2)$$

In equation (2), L is the pupil dimension, $\lambda$ is the wavelength, f is the lens focal length, $d_{obj}$ is the distance from the object to the lens and $d_{img}$ is the distance from the image to the lens. When misfocus occurs, the phase factor, given in equation (1), multiplies the pupil of the imaging system. As a result of that multiplication, the object is not imaged in the desired plane, where the detector is located, but in a different plane. As a result, the detector acquires a degraded image. It can be shown that our prior art phase mask, that is designed to handle such misfocus imaging conditions, is optimal in the sense of the MMSE criterion with respect to the optical field distribution. To satisfy that criterion one has to minimize the expression:

$$E^2 = \int_{\Delta\psi} d\psi \int_{\Omega} \int |h(x, y; \psi) - h_D(x, y)|^2 dx dy \quad (3)$$

In equation (3), x and y are the coordinates of the image plane, h is the PSF provided by the imaging system containing the mask and $h_D$ is the desired PSF. However, if one designs an imaging system to be operated with incoherent illumination, the expression in equation (3) is inadequate, because the error, as derived in that expression, depends on the phase of the point spread function, which is irrelevant for imaging systems that use incoherent illumination. Therefore, one should instead minimize a different expression, namely:

$$E^2 = \int_{\Delta\psi} d\psi \int_{\Omega} \int (|h(x, y; \psi)|^2 - |h_D(x, y)|^2)^2 dx dy \quad (4)$$

In other words, one must minimize the integrated squared difference between the PSF intensities rather than the integrated squared difference between the PSFs themselves.

Arbitrary changes of the phase of the PSF distribution that is derived for coherent illumination do not affect the incoherently illuminated image. Thus, the error calculated by equation (3) changes when this happens, whereas the error obtained by equation (4) does not. Therefore, in some exemplary embodiments of the present invention, the mask of the present invention is designed by minimizing equation (4). The mask that minimizes equation (4) cannot be found analytically; but a simulated annealing algorithm can be used in order to calculate it.

Specifically, the mask transmittance function is parameterized as a set of pixel amplitudes and phases associated with the pixels of the mask. Starting with an arbitrary distribution of amplitudes and phases and applying the simulated annealing algorithm, the mask that minimizes the error defined in equation (4) is obtained. Simulated annealing is described, for example, in S. Kirkpatrick et al., "Optimization by simulated annealing", *Science vol.* 220 pp. 671-680 (1983).

In some exemplary embodiments of the present invention, the search is limited to one-dimensional masks. A one-dimensional mask can be used in an imaging system that operates uni-dimensionally, for example to image one-dimensional structures such as bar codes. Alternatively, two orthogonal one-dimensional masks can be used in tandem, or a two-dimensional mask of the present invention can be fabricated as a single element whose transmittance is the product of two orthogonal one-dimensional distributions, so that the mask or masks act(s) as a separable two-dimensional function.

We have determined that compensation for misfocus occurring on both sides of the nominal "in-focus" position, represented by both positive values of $\psi$ and negative values of $\psi$, is achieved when the transmittance of the mask has an amplitude distribution that is symmetric and a phase distribution that is anti-symmetric.

The simulated annealing process allows the user to influence the optimization process by utilizing weight functions, in order to enhance or suppress specific spatial frequency regions. This is needed in order to achieve higher resolution, and to eliminate image contrast reversals that are not acceptable for high quality imagery.

The classic OTF for imaging under incoherent illumination has a triangular shape, as provided by a clear pupil in the "in-focus" condition (see e.g. J. W. Goodman, *Introduction to Fourier Optics* (McGraw-Hill, New York, 1996), p. 149 or E. Ben-Eliezer et al., "All-optical extended depth of field imaging system", *Journal of Optics A: Pure and Applied Optics* vol. 5 (2003), FIG. 3), cannot be maintained when an extended DOF is desired. It is well known that the OTF shape determines the contrast of the obtained image. It is expected that in order to maintain maximum resolution over the entire extended DOF, one should be ready to accept lower contrast values than those provided by the ideal "in focus" OTF curve. Referring now to the drawings, FIG. 1 shows an example of a typical OTF that represents the "desired OTF curve". This desired OTF curve was chosen to deliver images with a contrast of at least 10% for all normalized spatial frequencies up to 50% of the theoretical maximum that is attainable with a full aperture in an in-focus condition, followed by a smooth decline to zero at the ends of the normalized spatial frequency range. We also required that the phase differences between spatial frequency components of the desired OTF in the band of spatial frequencies of interest should vanish, so that image distortions due to relative phase shifts between different spatial frequencies are eliminated and thus high-quality images are obtained in such an all-optical system with no need for post-processing steps. High-quality images are generated over the entire range of misfocus positions $|\psi| \leq \psi_{max}$, as long as there are no phase differences between the spatial frequency components in the OTF region of interest. The corresponding PSF intensity distribution is the inverse Fourier transform of the desired OTF. The present invention is based on shaping the OTF to be close to the desired OTF.

Figure 2A:
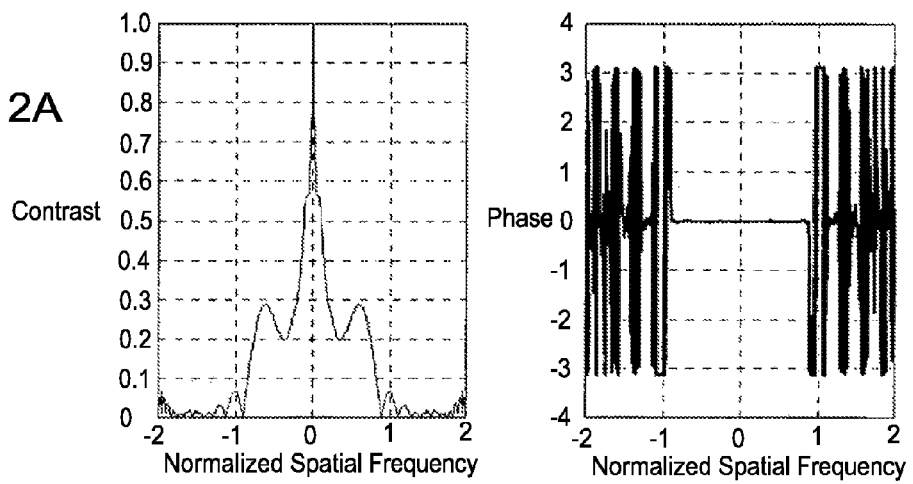
FIGS. 2A-2C are plots of OTFs of an imaging system that uses a one-dimensional mask of the present invention, at three values of ψ.
Figure 2B:
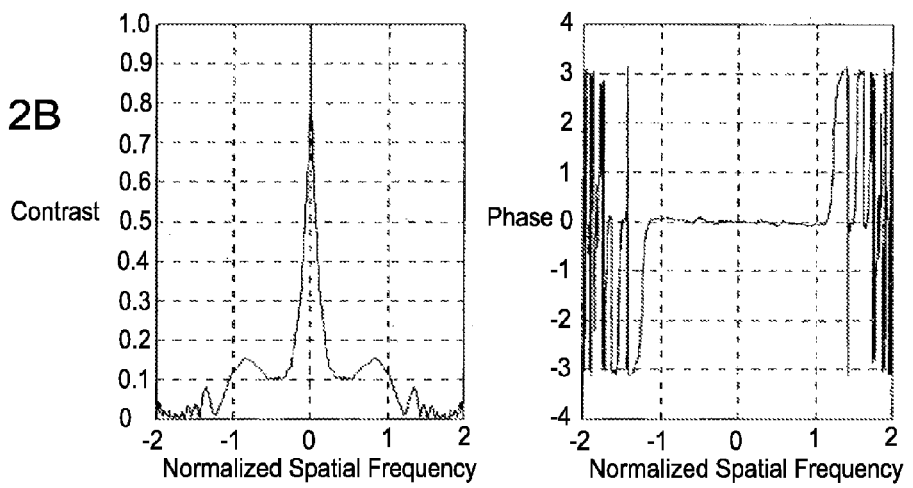
Figure 2C:
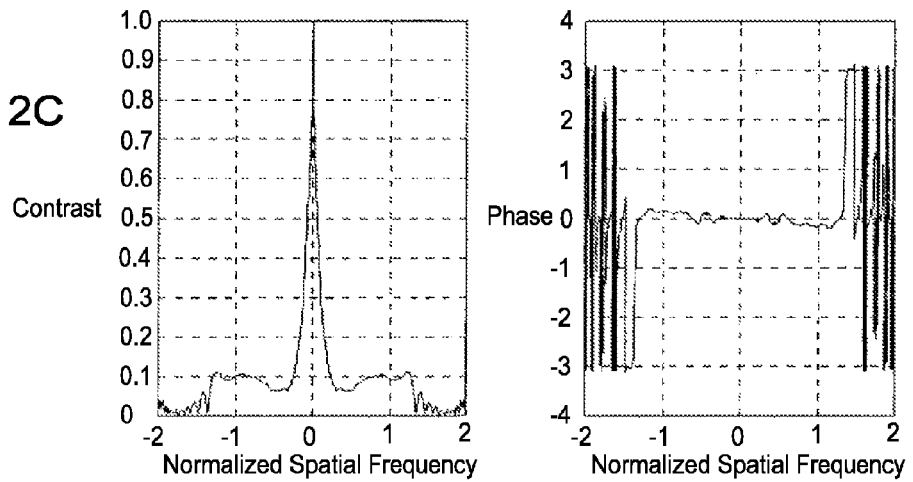

FIGS. 2A-2C are plots of the magnitude of the OTF curves, called MTF curves, as well as the respective phase of the OTF curves for several values of $\psi$. A sample design was carried out for an imaging system with a DOF that occupies the interval $\psi \in [-15, 15]$. FIG. 2A shows the magnitude and phase of the OTF for $\psi=0$. FIG. 2B shows the magnitude and phase of the OTF for $\psi=12$. FIG. 2C shows the magnitude and phase of the OTF for $\psi=14$. Note that all phases are expressed herein in units of radians. One notes that the phase essentially vanishes in the region where the contrast is significant. Therefore, good quality images can be acquired by this imaging system without any post-processing step.

Figure 3:
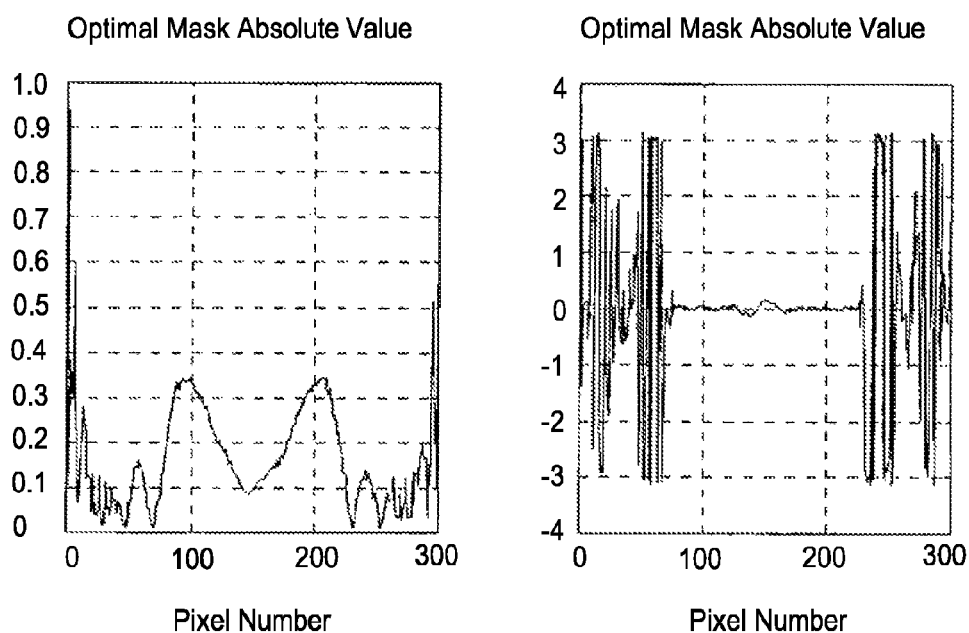
FIG. 3 shows the absolute value and the phase of the transmittance function of the one-dimensional mask whose OTFs are plotted in FIGS. 2A-2C.

We carried out computations of the MTF obtained with our prior art mask that is optimal for the coherent point spread function case vs. those obtained with the mask of the present invention. We found that the mask of the present invention provides an increase of about 30% in the highest obtainable resolution, when a contrast of 7% is assumed as baseline. The one-dimensional mask transmittance function itself of the present invention is shown in FIG. 3.

Figure 4A:
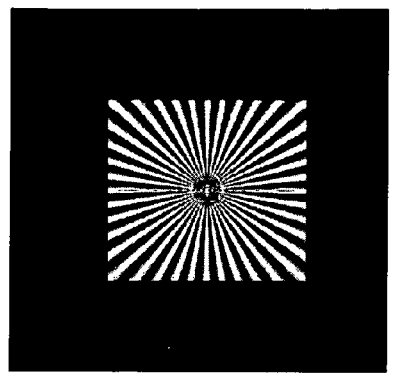
FIGS. 4A-4D are simulated images of a spoke target, imaged using a clear pupil vs. a separable mask of the present invention.
Figure 4B:
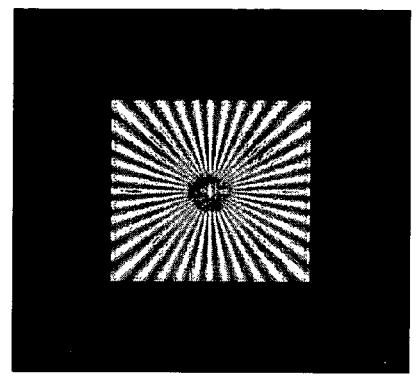
Figure 4C:
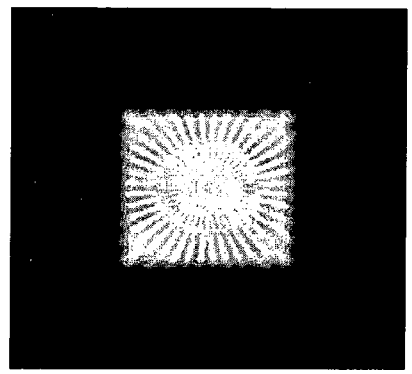
Figure 4D:
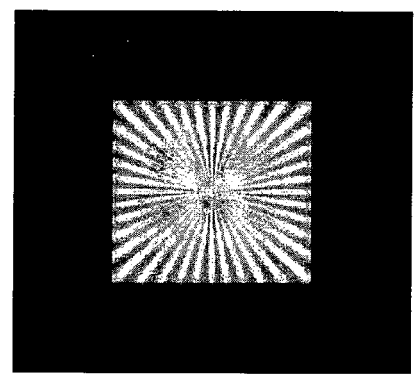

Computer simulations using a spoke target object imaged by an imaging system that incorporates either a separable mask or just a plain clear pupil are shown, for visual comparison, in FIGS. 4A-4D. The output images are provided for two cases: the first is taken in an "in-focus" position, and the second is obtained for an object located in a position corresponding to ψ=±12. Assuming a low $f_\#$ and a nominal in-focus magnification of −1, we disregarded the slight deviations in magnification due to different object locations. The images of FIGS. 4A and 4C correspond to the clear pupil imaging system, while the images of FIGS. 4B and 4D correspond to the separable mask of the present invention. FIGS. 4A and 4B are for the "in-focus" condition, i.e. ψ=0, and FIGS. 4C and 4D are for ψ=±12.

One can readily see the improvement in the extent of depth of field that the separable mask provides with respect to a same sized, clear aperture imaging system.

The separable mask of the present invention provides high resolution primarily in the x and y direction, as can be observed in the results presented in FIGS. 4B and 4D, which match the MTF curve behavior presented earlier in FIGS. 2A-2C. We readily notice that the separable mask of the present invention improves the performance of the imaging system. However, as often occurs in case of separable pupil functions, the contrast in directions other than x and y is reduced, due to multiplications of low MTF values in these directions. It is seen in FIG. 4D that the spatial frequencies for the ±45° orientations, for example, exhibit very low contrast, so that the image quality in these directions is reduced.

The mathematical features of the one dimensional optimal mask transmittance function, shown in FIG. 3, reveal that this is an almost perfect real function, with negligible imaginary components. As such, one may consider an embodiment in which this function is represented as a real and symmetric function.

Figure 5A:
FIGS. 5A and 5B show the amplitude and phase distributions of a radial mask transmittance function of the present invention.
Figure 5B:
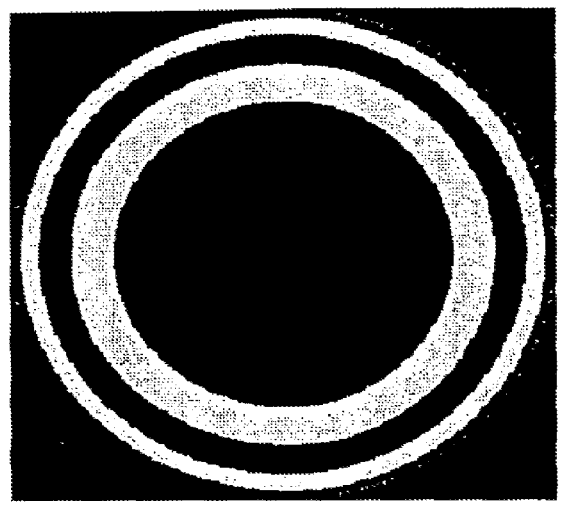

We can generate a radial mask transmittance function by rotating the separable mask transmittance function around the origin of a polar coordinate system and averaging over all values of the polar angle. The resulting mask transmittance function has an amplitude distribution as shown in FIG. 5A, where light colors represents high transmittance and dark colors represent low transmittance. The phase of this mask transmittance function is shown in FIG. 5B, where white stands for regions of π phase shifts, and black defines regions with no phase shift.

Alternatively, instead of averaging a separable distribution over polar angles, a radial distribution is generated directly by performing a simulated annealing procedure on a radial 2D distribution function.

FIGS. 6A-6F show the magnitudes (FIGS. 6A-6C) and phases (FIGS. 6D-6F) of the corresponding OTF cross sections, under in-focus conditions, i.e., ψ=0 (FIGS. 6A and 6D), misfocus condition ψ=±12 (FIGS. 6B and 6E) and misfocus condition ψ=±14 (FIGS. 6C and 6F).

A comparison between the MTF curves of the radial mask, shown in FIGS. 6A-6C, and the MTF curves along the x or y directions of the separable mask, shown in FIG. 2A-2C, reveals that the resolution is improved in all directions when using the radial mask, when compared to the highest resolution obtained along the x and y directions achieved with the separable mask. However, the contrast achieved with the radial mask in case of severe misfocus is lower than the contrast obtained with the separable mask in the x and y directions.

The reason that the radial mask transmittance function works so well is closely related to the fact that the one-dimensional mask transmittance function, with the phase quantized, is almost perfectly symmetric and real. Thus, when one sums the rotated separable mask transmittance function in all orientations, the resulting amplitude and phase are radial, that is:

$$\tilde{M}(r) = \frac{1}{2\pi} \int_\alpha^{\alpha+2\pi} M_{sep}(r, \theta) d\theta \quad (5)$$

In equation (5), $M_{sep}(r,\theta)$ is the separable pupil function, and M(r) is the obtained radial pupil mask. This radial mask acts as a multi focal lens, and therefore ameliorates the sensitivity of the conventional imaging system to misfocus conditions, when placed at the pupil plane.

If an OTF other than the one illustrated in FIG. 1 is chosen, a different transmittance function is obtained. If the resulting transmittance function is sufficiently close to being symmetric and real, then rotational averaging as in equation (5) is possible, thereby achieving a radial transmittance function. If this is not the case, the transmittance function can be used in a separable mask configuration.

Equation (5) is just one representation of the composite mask generation of the present invention. Many other summation, averaging, and other mathematical operations are possible for manufacturing and generation of other masks that could achieve similar purpose, perhaps with slightly different emphasis. Moreover, the simulated annealing approach can be used with the additional constraint that the resulting mask should be rotationally symmetrical, thus obtaining the desired radial mask directly.

Simulated annealing can also be used to design amplitude-only radial distributions, phase-only radial distributions, or distributions subject to any other constraints imposed by the designer, such as restrictions on the number of quantization levels (e.g. requiring only two phase levels).

One way to fabricate a complete radial mask, having both amplitude variations and phase variations, is as a diffractive optic element (DOE). In each one of the DOE pixels we uncover a circle, whose area is proportional to the amplitude of the computed radial mask transmittance function in order to imitate the desired amplitude response of the mask (FIG. 5A) at that particular pixel. The phase variations, that consist of only two levels, i.e. a phase shift of π and no phase shift at all, are readily obtained by a single step etching procedure (reactive ion or wet).

One method of DOE fabrication is as follows. A transparent glass plate is covered with a layer of chrome and with a layer of photoresist. First, we expose the photoresist only over the circles that belong to pixels in the regions that need to be etched in glass (where a π phase shift should be created). The chrome layer that covers the glass in these circles is removed, and through these holes, the glass itself is etched down to a depth that provides a phase shift of π. At the end of this step the DOE regions, where a phase of π is required, are ready with their associated amplitudes, which are the areas of the holes through which the glass was etched.

At this stage, the glass plate is covered again by a photoresist layer, and we expose only the circles in the regions where no phase shift is required. Thereafter, the chrome is removed from these circles, clearing up the transmission region with unetched glass.

The last step is the removal of the photoresist from the whole plate. The original chrome metal layer that covers the glass is not removed from the regions between the holes during the process, and is not removed at the end of the fabrication as well, as opposed to the fabrication procedure of a phase-only DOE.

We now compare the coherent point spread function (PSF) of the DOE radial mask, where amplitude values were defined by the circle area in each pixel, and the PSF that would have been achieved if we could control the transmission of each pixel uniformly over its entire area. We refer to the latter mask as "the ideal mask". We show that they are almost identical. To see that, we derive the PSF for both cases. Let $A_{mn}$ and $\phi_{mn}$ be the amplitude and phase of the pixel {m,n}. Then the "ideal mask" can be expressed by:

$$M(x, y) = \sum_{m,n} A_{mn} rect\left(\frac{x - (m + 0.5)\Delta}{\Delta}\right) rect\left(\frac{y - (n + 0.5)\Delta}{\Delta}\right) \exp(j\varphi_{mn}) \quad (6)$$

where $\Delta$ is the pixel size, and rect(x) is equal to unity in the region |x|<0.5 and zero elsewhere.

The DOE embodiment of the radial mask of FIGS. 5A and 5B, on the other hand, is represented by the expression:

$$M(x, y) = \sum_{m,n} circ\left(\frac{\sqrt{[x - (m - 0.5)\Delta]^2 + [y - (n - 0.5)\Delta]^2}}{r_{mn}}\right) \exp(j\varphi_{mn}) \quad (7)$$

where circ(r) is unity within the circle defined by a radius of r=1 and zero otherwise.

The radius of each circle, $r_{mn}$, is related to the amplitude $A_{mn}$ by the expression:

$$r_{mn} = r_{max}\sqrt{\frac{A_{mn}}{A_{max}}} \quad (8)$$

where $A_{max}$ is the maximal amplitude of the mask (usually 1), and $r_{max}$ is the radius that we attach to the maximal amplitude. Usually, $r_{max}$ is slightly smaller than $\Delta/2$, so that the circles in adjacent pixels are always separated and do not overlap.

The resulting PSF, obtained by the ideal mask, given in equation (6), can be expressed as:

$$PSF_{des}(x_0, y_0) = \sum_{m,n} A_{mn}\Delta^2 sinc\left(\Delta\frac{x_o}{\lambda d_{img}}\right) sinc\left(\Delta\frac{y_o}{\lambda d_{img}}\right) \times \quad (9)$$

$$\exp\left\{j\left[\varphi_{mn} + 2\pi\Delta\left((m - 0.5)\frac{x_o}{\lambda d_{img}} + (n - 0.5)\frac{y_o}{\lambda d_{img}}\right)\right]\right\}$$

where $x_o$ and $y_o$ are the spatial coordinates of the plane in which the PSF is measured. Similarly, the resulting PSF, obtained by the DOE embodiment of the radial mask of FIGS. 5A and 5B is represented by:

$$PSF_{circ}(x_0, y_0) = \sum_{m,n} \pi r_{mn}^2 \frac{J_1\left(2\pi r_{mn}\sqrt{x_0^2 + y_0^2}\big/\lambda d_{img}\right)}{\pi r_{mn}\sqrt{x_0^2 + y_0^2}\big/\lambda d_{img}} \times \quad (10)$$

$$\exp\left\{j\left[\varphi_{mn} + 2\pi\Delta\left((m - 0.5)\frac{x_o}{\lambda d_{img}} + (n - 0.5)\frac{y_o}{\lambda d_{img}}\right)\right]\right\}$$

Because most of the PSF energy is located in the vicinity of the origin, we are allowed to use the approximation:

$$\frac{J_1\left(2\pi r_{mn}\sqrt{x_0^2 + y_0^2}\big/\lambda d_{img}\right)}{\pi r_{mn}\sqrt{x_0^2 + y_0^2}\big/\lambda d_{img}} \approx sinc(\Delta x_o/\lambda d_{img})sinc(\Delta y_o/\lambda d_{img}) \quad (11)$$

$$\approx 1$$

and because we took the areas of the circles to be proportional to the ideal mask pixel amplitudes, as expressed in equation (8), the PSF results of equations (9) and (10) have the same shape in the vicinity of the origin, where most of the energy is located.

The corresponding intensity impulse responses are obtained from the coherent PSFs of both masks by calculating their absolute values squared (See Goodman, p. 134).

Figure 7A:
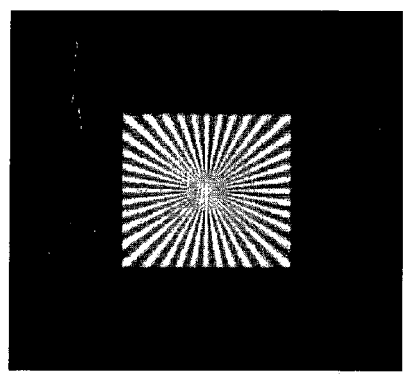
FIGS. 7A-7D are simulated images of a spoke target, imaged using the separable mask of FIGS. 4B and 4D vs. using the radial mask of FIGS. 5A and 5B.
Figure 7B:
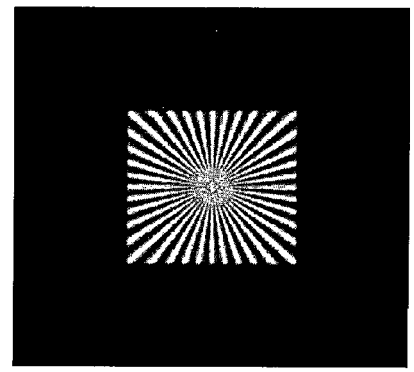
Figure 7C:
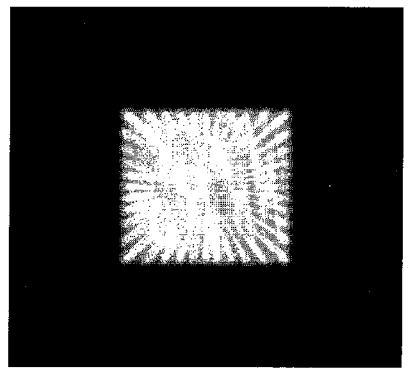
Figure 7D:
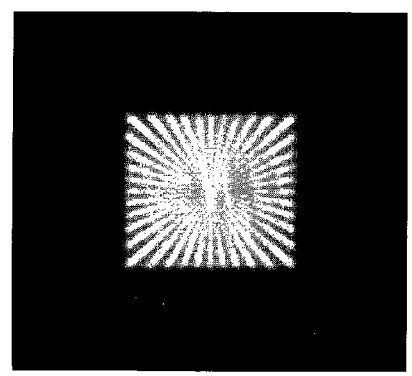

Simulation results of spoke target images are shown in FIGS. 7A-7D. FIGS. 7A and 7C show the resulting images when one uses the separable mask. FIGS. 7B and 7D provide the results obtained for the radial mask. FIGS. 7A and 7B show the images in focus, while in FIGS. 7C and 7D results for misfocus condition of ψ=±15 are provided. It is clearly realized that contrast, as well as resolution, are improved when we use the radial mask (FIGS. 7B and 7D). Moreover, spatial frequencies at all polar angles behave in the same fashion, as expected from the MTF curves of FIGS. 6A-6C.

Figure 8A:
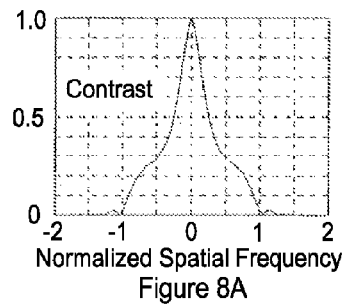
FIGS. 8A-8I are MTF plots for three radial masks of the present invention at three values of ψ.
Figure 8B:
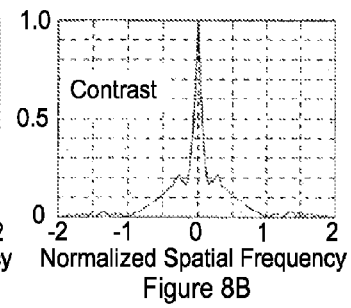
Figure 8C:
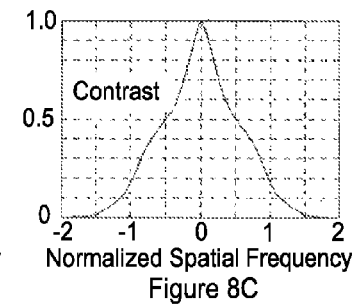
Figure 8D:
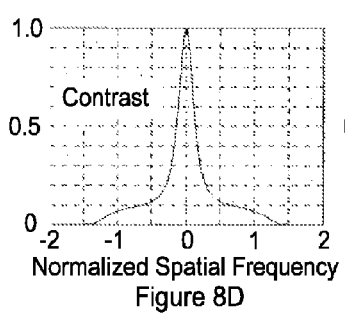
Figure 8E:
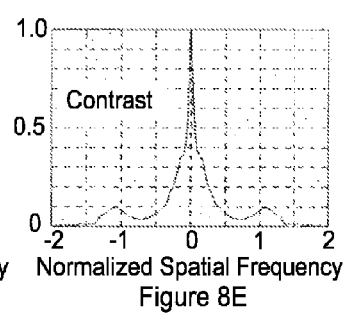
Figure 8F:
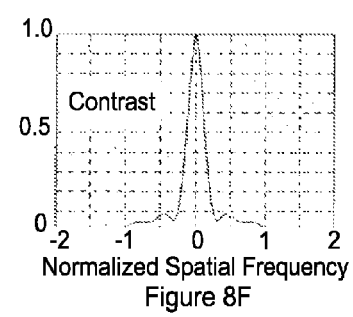
Figure 8G:
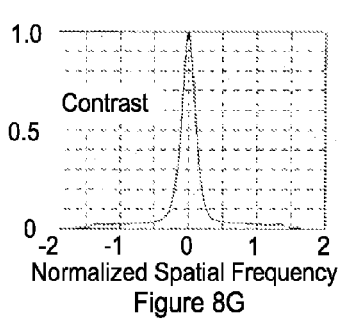
Figure 8H:
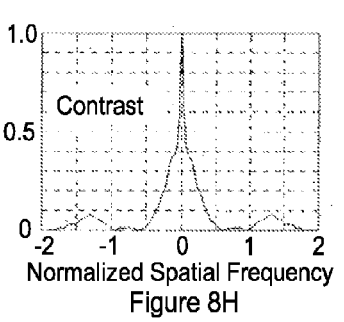
Figure 8I:
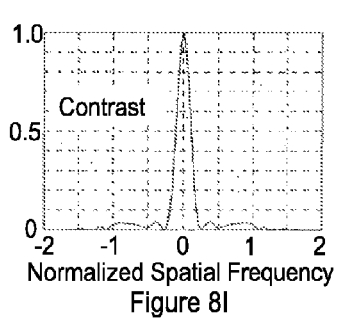

We compared the behavior of the complete radial mask that has both amplitude and phase variations to the "phase mask only" which retains only the phase component of the complete radial mask. We also compare the behavior of the complete radial mask to that of the amplitude-only mask obtained from only the amplitude of the complete radial mask. We calculated the MTF curves for both cases, and found out that the amplitude-only mask can handle a DOF up to about |ψ|≤12, which is smaller than the DOF that the phase-only mask can handle, which is |ψ|≤14. The main advantage of the phase-only mask over the complete radial mask and the amplitude-only mask is higher light throughput. Nevertheless, for both phase-only and amplitude-only masks there are no image contrast reversals within the DOF of |ψ|≤14 for normalized spatial frequencies in the range of |v|≤1. Therefore, the performances of the phase-only mask and of the amplitude-only mask are limited by poor contrast. FIGS. 8A-8I are plots of the MTF curves for all three masks. FIGS. 8A, 8D and 8G show the MTF curves of the optimal mask (with variations in both amplitude and phase). FIGS. 8B, 8E and 8H show the MTF curves of the phase only mask, and FIGS. 8C, 8F and 8I show the MTF curves of the amplitude only mask. FIGS. 8A-8C show the results for in-focus condition, and FIGS. 8G-8I show the results obtained for misfocus of ψ=±15. The misfocus condition of ψ=±12 is shown in FIGS. 8D-8F.

Figure 9A:
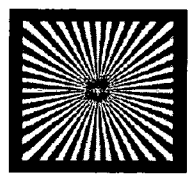
FIGS. 9A-9L are simulated images of a spoke target, imaged using a clear pupil vs. the three radial masks whose MTFs are shown in FIGS. 8A-8I, at three values of ψ.
Figure 9B:
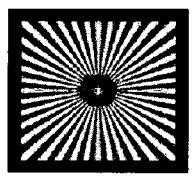
Figure 9C:
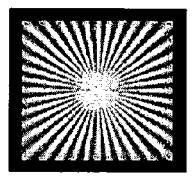
Figure 9D:
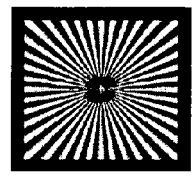
Figure 9E:
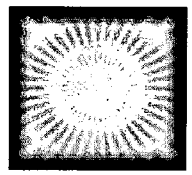
Figure 9F:
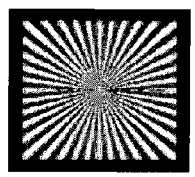
Figure 9G:
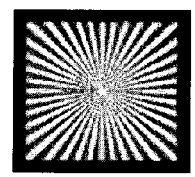
Figure 9H:
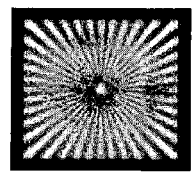
Figure 9I:
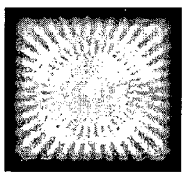
Figure 9J:
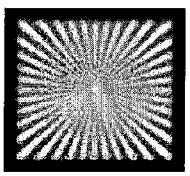
Figure 9K:
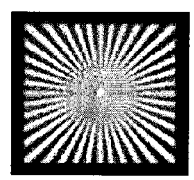
Figure 9L:
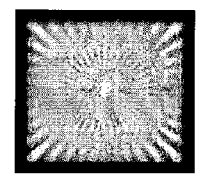

Simulation results for all the radial masks mentioned above are presented in FIGS. 9A-9L. FIGS. 9A, 9E and 9I show the images obtained with a conventional imaging system, i.e. with clear aperture. FIGS. 9B, 9F and 9J present the images that the same imaging system provides, when one places the radial mask at the pupil. FIGS. 9C, 9G and 9K show the images acquired by the imaging system when the phase-only mask is mounted at its aperture, and in FIGS. 9D, 9H and 9L are shown the images provided when the amplitude-only mask is used. FIGS. 9A-9D present the simulation images acquired in focus. FIGS. 9E-9H show the images taken in misfocus condition of $\psi=\pm12$, and FIGS. 9I-9L present the images obtained for an extreme misfocus condition of $\psi=\pm15$.

We conclude that for the examined examples, the complete radial optimal mask provides the best combination between contrast and resolution, at the expense of reducing light throughput by more than 80%. The phase-only radial mask of this example, which retains only the phase of the optimal radial mask, provides high light throughput (the reduction of light throughput is only 8%), as well as an acceptable resolution and contrast for a misfocus condition up to $|\psi|=14$.

The manufacture of the phase mask of the above example is very easy to accomplish, as it needs only coarse details and requires only two-phase levels, that is 0 and $\pi$, so that a single binary mask is required for its production.

Such a phase mask has many applications, e.g. for general-purpose lenses, computer vision, automatic vision, barcode readers, surveillance cameras, mobile phone cameras, monitors, etc.

Figure 10:
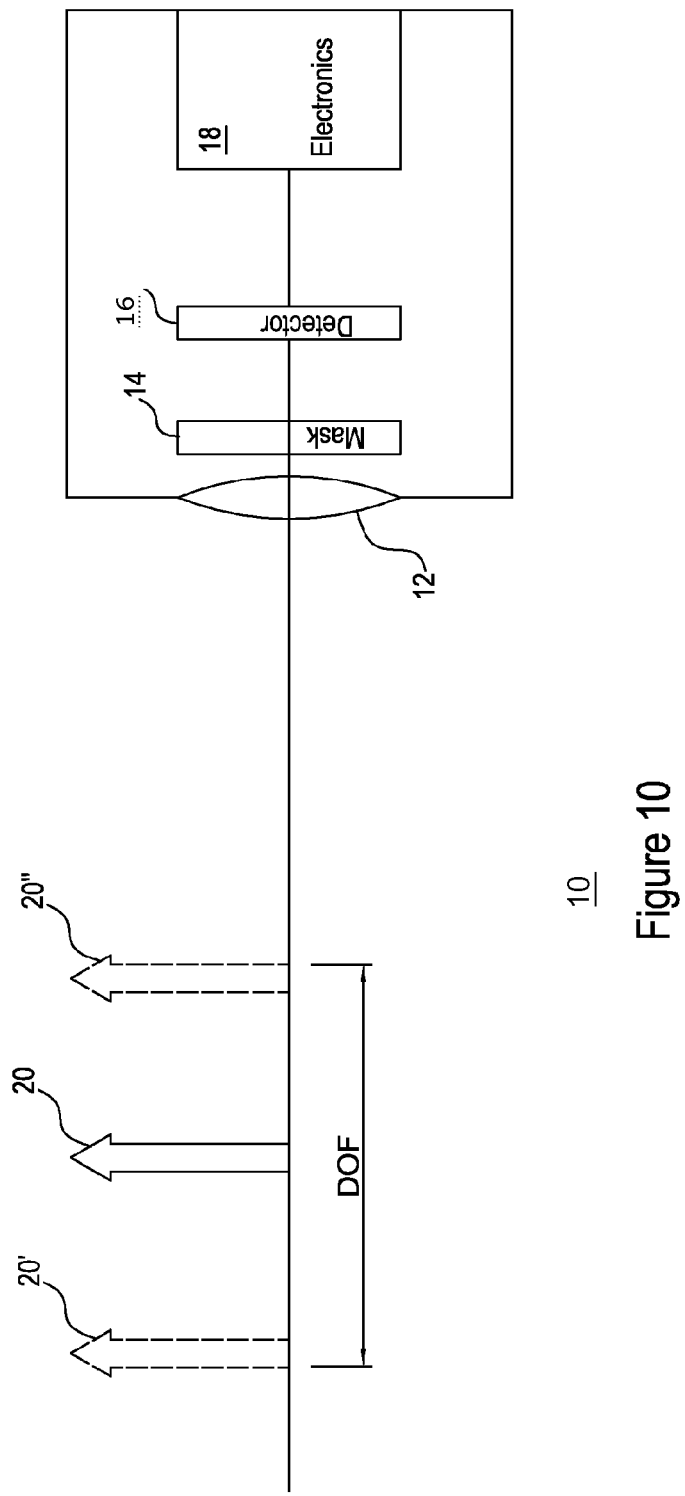
FIG. 10 is a schematic block diagram of an imaging device of the present invention.

FIG. 10 is a schematic high-level block diagram of a generalized imaging device 10 of the present invention, for imaging an object 20. Imaging device 10 includes optics 12, that are represented symbolically in FIG. 10 as a convex lens, for projecting an image of object 20 onto a detector 16. Detector 16 may be an electronic detector (e.g. CCD or CMOS), a conventional photographic film or plate, or any other light-sensitive material. A mask 14 of the present invention is placed in or near the pupil of imaging device 10. If detector 16 is an electronic detector, then electronics 18 are provided for, e.g., digitizing the output of detector 16, storing the digitized output, displaying the digitized output, etc. Object 20 may be located anywhere in the DOF region, as indicated by arrows 20' and 20".

While the invention has been described with respect to a limited number of embodiments, it will be appreciated that many variations, modifications and other applications of the invention may be made.

We claim:

1. A method of optical element manufacturing, the method comprising:
   selecting a range of a misfocus parameter $\Psi$ that spans between misfocus parameter $\Psi$ values of at least +12 and −12; and designing the optical element to comprise multiple regions, wherein an optical transfer function (OTF) of the optical element allows, for the range of the misfocus parameter $\Psi$, transmission of images with a contrast of at least 10% for all normalized spatial frequencies up to 50% of a theoretical maximum that is attainable with a full aperture in an in-focus condition.

2. The method according to claim 1 wherein the OTF of the optical element is a Fourier transform of an image plane intensity of a point spread function (PSF) and wherein the multiple regions of the optical element have a configuration of optical properties that minimizes a difference between the OTF of the optical element and a desired OTF within the range of the misfocus parameter $\Psi$.

3. The method according to claim 2 wherein an absolute value of a maximum misfocus parameter $|\Psi_{\text{sub.max}}|$ is greater than 12.

4. The method according to claim 2 wherein an absolute value of a maximum misfocus parameter $|\Psi_{\text{sub.max}}|$ is greater than 14.

5. The method according to claim 2, comprising designing the multiple regions to be characterized by introducing phase shifts that are either substantially zero or substantially 180 degrees.

6. The method according to claim 2, comprising designing the multiple regions to be characterized by a substantially same attenuation factor.

7. The method according to claim 2, comprising designing the multiple regions so that at least some of the regions are characterized by different attenuation factors.

8. The method according to claim 2, comprising designing the multiple regions so that attenuation factors of the multiple regions have a substantially symmetric spatial distribution.

9. The method according to claim 2, comprising designing the multiple regions to be characterized by a substantially same phase shift.

10. The method according to claim 2, comprising designing the multiple regions so that attenuation factors of the multiple regions have a substantially symmetric spatial distribution.

11. The method according to claim 2, comprising designing the multiple regions so that attenuation factors of the multiple regions exhibit radial symmetry.

12. The method according to claim 2, further comprising fabricating the optical element.

13. The method according to claim 2 wherein the desired OTF is characterized by a band of spatial frequencies for which phases are substantially the same.

14. The method according to claim 13, wherein an absolute value of a maximum spatial frequency in a band of spatial frequencies is equal to or greater than about 50% of a maximum spatial frequency of an optical device determined by a full aperture of the optical device for imaging a scene in-focus.

15. The method according to claim 13, wherein for each spatial frequency in a band of spatial frequencies the OTF of the optical element has a contrast ratio normalized to a maximum contrast ratio of the OTF of the optical element that is greater than or equal to 0.10.

16. The method according to claim 13 wherein an absolute value of a maximum spatial frequency in the band of spatial frequencies is equal to or greater than about 60% of a maximum spatial frequency of an optical device determined by a full aperture of the optical device for imaging a scene in-focus.

17. The method according to claim 13 wherein for each spatial frequency in a band of spatial frequencies, the OTF of the optical element has a contrast ratio normalized to a maximum contrast ratio of the OTF of the optical element that is greater than or equal to 0.07.

18. The method according to claim 13, wherein an absolute value of a maximum spatial frequency in a band of spatial frequencies is equal to or greater than about 70% of a maximum spatial frequency of an optical device determined by a full aperture of the optical device for imaging a scene in-focus.

* * * * *